(12) United States Patent
Soundararajan

(10) Patent No.: US 10,284,219 B2
(45) Date of Patent: May 7, 2019

(54) INBUILT THRESHOLD COMPARATOR

(71) Applicant: Texas Instruments Incorporated, Dallas, TX (US)

(72) Inventor: Rishi Soundararajan, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/139,113

(22) Filed: Sep. 24, 2018

(65) Prior Publication Data

US 2019/0028113 A1  Jan. 24, 2019

Related U.S. Application Data

(63) Continuation of application No. 15/864,090, filed on Jan. 8, 2018, now Pat. No. 10,116,321, which is a continuation of application No. 15/466,691, filed on Mar. 22, 2017, now Pat. No. 9,917,594.

(30) Foreign Application Priority Data

Sep. 6, 2016 (IN) .............................. 201641030375

(51) Int. Cl.
| H03M 1/12 | (2006.01) |
| H03M 1/46 | (2006.01) |
| H03K 5/24 | (2006.01) |
| H03M 1/06 | (2006.01) |
| H03M 1/48 | (2006.01) |
| H03M 1/44 | (2006.01) |
| H03M 1/36 | (2006.01) |

(52) U.S. Cl.
CPC ............ *H03M 1/46* (2013.01); *H03K 5/2481* (2013.01); *H03M 1/0607* (2013.01); *H03M 1/36* (2013.01); *H03M 1/44* (2013.01); *H03M 1/48* (2013.01)

(58) Field of Classification Search
CPC ........ H03M 1/361; H03M 1/56; H03M 1/365; H03M 1/002; H03M 1/36; H03M 1/1023; H03M 1/34; H03M 1/001; H03M 1/363; H03M 3/38; H03M 3/384; H03M 7/165
USPC ................ 341/135, 136, 155, 156, 158, 159
See application file for complete search history.

(56) References Cited

U.S. PATENT DOCUMENTS

| 5,416,484 A | 5/1995 | Lofstrom |
| 5,459,465 A | 10/1995 | Kagey |
| 5,729,230 A * | 3/1998 | Jensen .................. H03M 3/396 341/118 |

(Continued)

*Primary Examiner* — Linh V Nguyen
(74) *Attorney, Agent, or Firm* — John R. Pessetto; Charles A. Brill; Frank D. Cimino

(57) ABSTRACT

A comparator includes a first input stage coupled to a first signal input and a first reference input, wherein the first input stage is coupled between a first node and a second node. A second input stage is coupled to a second signal input and a second reference input, wherein the second input stage is coupled between a third node and the second node. An output stage generates at least one output signal in response to the first and second input signals. First switching circuitry is coupled between the first node and the output stage. The first switching circuitry is for coupling the first node to a fourth node in response to a reset signal. Second switching circuitry is coupled between the third node and the output stage. The second switching circuitry is for coupling the third node to a fifth node in response to the reset signal.

10 Claims, 8 Drawing Sheets

(56) References Cited

U.S. PATENT DOCUMENTS

| | | | | |
|---|---|---|---|---|
| 6,144,231 A * | 11/2000 | Goldblatt | ............... | G11C 7/065 |
| | | | | 327/57 |
| 6,163,215 A * | 12/2000 | Shibata | ................ | H03G 1/0023 |
| | | | | 327/359 |
| 6,369,732 B1 * | 4/2002 | Liu | ........................ | H03M 1/36 |
| | | | | 341/143 |
| 6,584,157 B1 * | 6/2003 | Van Der Zwan | ....... | H03M 3/41 |
| | | | | 375/247 |
| 7,375,559 B1 | 5/2008 | Cho et al. | | |
| 7,501,862 B2 | 3/2009 | Su et al. | | |
| 2007/0176890 A1 * | 8/2007 | Czepek | ................. | C02F 3/1263 |
| | | | | 345/156 |
| 2007/0216557 A1 * | 9/2007 | Ebner | ................... | H03M 3/384 |
| | | | | 341/143 |
| 2008/0001807 A1 | 1/2008 | Chiu | | |
| 2008/0211705 A1 | 9/2008 | Bore et al. | | |
| 2008/0246645 A1 | 10/2008 | Scholtens | | |
| 2008/0258952 A1 * | 10/2008 | Maezawa | ............... | H03M 3/458 |
| | | | | 341/143 |
| 2009/0066555 A1 | 3/2009 | Van Der Plas et al. | | |
| 2009/0179787 A1 | 7/2009 | Naka et al. | | |
| 2012/0044103 A1 | 2/2012 | Kaihara et al. | | |
| 2013/0021189 A1 | 1/2013 | Kabir et al. | | |
| 2013/0063291 A1 | 3/2013 | Srinivasan et al. | | |
| 2013/0187803 A1 * | 7/2013 | Kaald | ..................... | H03M 3/37 |
| | | | | 341/143 |
| 2013/0214950 A1 * | 8/2013 | Hojabri | ................. | H03M 3/494 |
| | | | | 341/143 |
| 2013/0214951 A1 * | 8/2013 | Ho | ........................... | H03M 3/37 |
| | | | | 341/143 |
| 2014/0062621 A1 * | 3/2014 | Dai | ...................... | H03H 11/481 |
| | | | | 333/216 |
| 2015/0222286 A1 | 8/2015 | Zhang et al. | | |

\* cited by examiner

| CONFIG | P-INPUT | | | | | | | M-INPUT | | | | | | | THRESHOLD VOLTAGE $V_{TH}$ |
|---|---|---|---|---|---|---|---|---|---|---|---|---|---|---|---|
| | $W_{in}$ | $W_{r1}$ | $W_{r1}$ | $W_{r2}$ | $W_{r2}$ | | | $W_{in}$ | $W_{r1}$ | $W_{r1}$ | $W_{r2}$ | $W_{r2}$ | | | |
| 1 | INP | REFP | REFP | REFP | REFP | | | INM | REFM | REFM | REFM | REFM | | | $2* \left( \dfrac{W_{r1}+W_{r2}}{W_i} \right) * (Vrefm - Vrefp)$ |
| 2 | INP | REFP | REFP | REFP | REFM | | | INM | REFM | REFM | REFM | REFP | | | $2* \left( \dfrac{W_{r1}}{W_i} \right) * (Vrefm - Vrefp)$ |
| 3 | INP Q51 | REFP Q61 | REFM Q62 | REFP Q63 | REFM Q64 | | | INM Q52 | REFM Q66 | REFP Q65 | REFM Q68 | REFP Q67 | | | 0 |
| 4 | INP Q51 | REFM Q71 | REFM Q72 | REFP Q73 | REFM Q74 | | | INM Q52 | REFP Q76 | REFP Q75 | REFM Q78 | REFP Q77 | | | $2* \left( \dfrac{W_{r1}}{W_i} \right) * (Vrefp - Vrefm)$ |
| 5 | INP | REFM | REFM | REFM | REFM | | | INM | REFP | REFP | REFP | REFP | | | $2* \left( \dfrac{W_{r1}+W_{r2}}{W_i} \right) * (Vrefp - Vrefm)$ |

FIG. 8

INBUILT THRESHOLD COMPARATOR

CROSS REFERENCE TO RELATED APPLICATION(S)

This continuation application claims priority to U.S. patent application Ser. No. 15/864,090, filed Jan. 8, 2018, which claims priority to U.S. patent application Ser. No. 15/466,691, filed Mar. 22, 2017, which claims priority to Indian provisional patent application No. 201641030375, filed Sep. 6, 2016, all of which are hereby incorporated herein by reference in their entirety.

BACKGROUND

Direct sampling receivers convert received signals directly to digital signals for subsequent processing. Direct sampling receivers offer flexibility of use over multiple frequency bands and can improve performance using digital filters that replace less accurate analog counterparts. Speed limitations of analog-to-digital converters (ADCs) implemented within direct sampling receivers limit the performance of ADCs at high sampling frequencies, especially when higher resolution is required.

Comparators are the fundamental building blocks of many types of ADCs and generally dictate the power, performance, and speed of operation of an ADC. Comparators have limitations that lead to significant limitations in the performance and power consumption of ADCs, which negatively impact the overall performance of digital sampling receivers and other devices that include ADCs.

SUMMARY

Comparators, including inbuilt threshold comparators, are disclosed herein. An example of a comparator includes a first input stage coupled to a first signal input and a first reference input, wherein the first input stage is coupled between a first node and a second node. A second input stage is coupled to a second signal input and a second reference input, wherein the second input stage is coupled between a third node and the second node. An output stage generates at least one output signal in response to signals at the first and second signal inputs. First switching circuitry is coupled between the first node and the output stage. The first switching circuitry is for coupling the first node to a fourth node in response to a reset signal. Second switching circuitry is coupled between the third node and the output stage. The second switching circuitry is for coupling the third node to a fifth node in response to the reset signal.

BRIEF DESCRIPTION OF THE DRAWINGS

FIG. 8 is a chart showing different threshold voltages for different input stage configurations of the comparator of FIG. 5.

DETAILED DESCRIPTION

Inbuilt threshold comparators for use in devices such as high-speed analog-to-digital converters (ADCs) are disclosed herein. ADCs are vital in direct sampling receivers and a plurality of other electronic devices. A direct sampling receiver receives a signal, such as a high frequency RF signal, and converts it to a digital signal for processing. Direct sampling receivers offer flexibility of use over multiple frequency bands and can improve performance using digital filters that replace less accurate analog filters. Speed limitations of the ADCs limit the performance of direct sampling receivers at high sampling frequencies, especially when higher resolution is required. Implementations of high speed ADCs generally come with penalties of high power consumption, increased area, and reduced performance.

Figure 1:
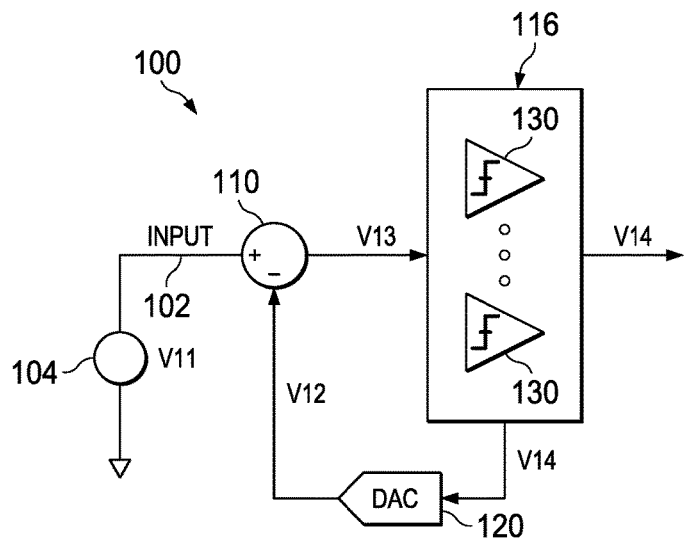
FIG. 1 is a block diagram of an example analog-to-digital converter (ADC).

FIG. 1 is a block diagram of an example ADC 100 system. The ADC system 100 has an input 102 coupled to an analog signal source 104 that generates an analog signal V11. In some examples, the signal source 104 is an analog receiver of a direct sampling receiver (not shown) and the analog signal V11 is an analog signal received by the direct sampling receiver. The signal source 104 may be any device that generates the signal being processed as described herein. The input 102 is coupled to an adder 110 that subtracts an analog signal V12 from the signal V11 to generate a signal V13 that is the difference between the signals V11 and V12. The output of the adder 110 is coupled to an ADC 116 that generates a digital signal V14, which is the output of the ADC system 100. The signal V14 is input to a digital-to-analog converter (DAC) 120 that converts the signal V14 to the analog signal V12.

The ADC 116 includes a plurality of comparators 130 that compare different reference voltages (not shown in FIG. 1) to the signal V13. The comparators 130 are the fundamental building blocks of the ADC system 100 and generally dictate the power, performance, and speed of operation of the ADC system 100. Improved comparators are disclosed herein that improve the performance and speed of ADCs.

Figure 2:
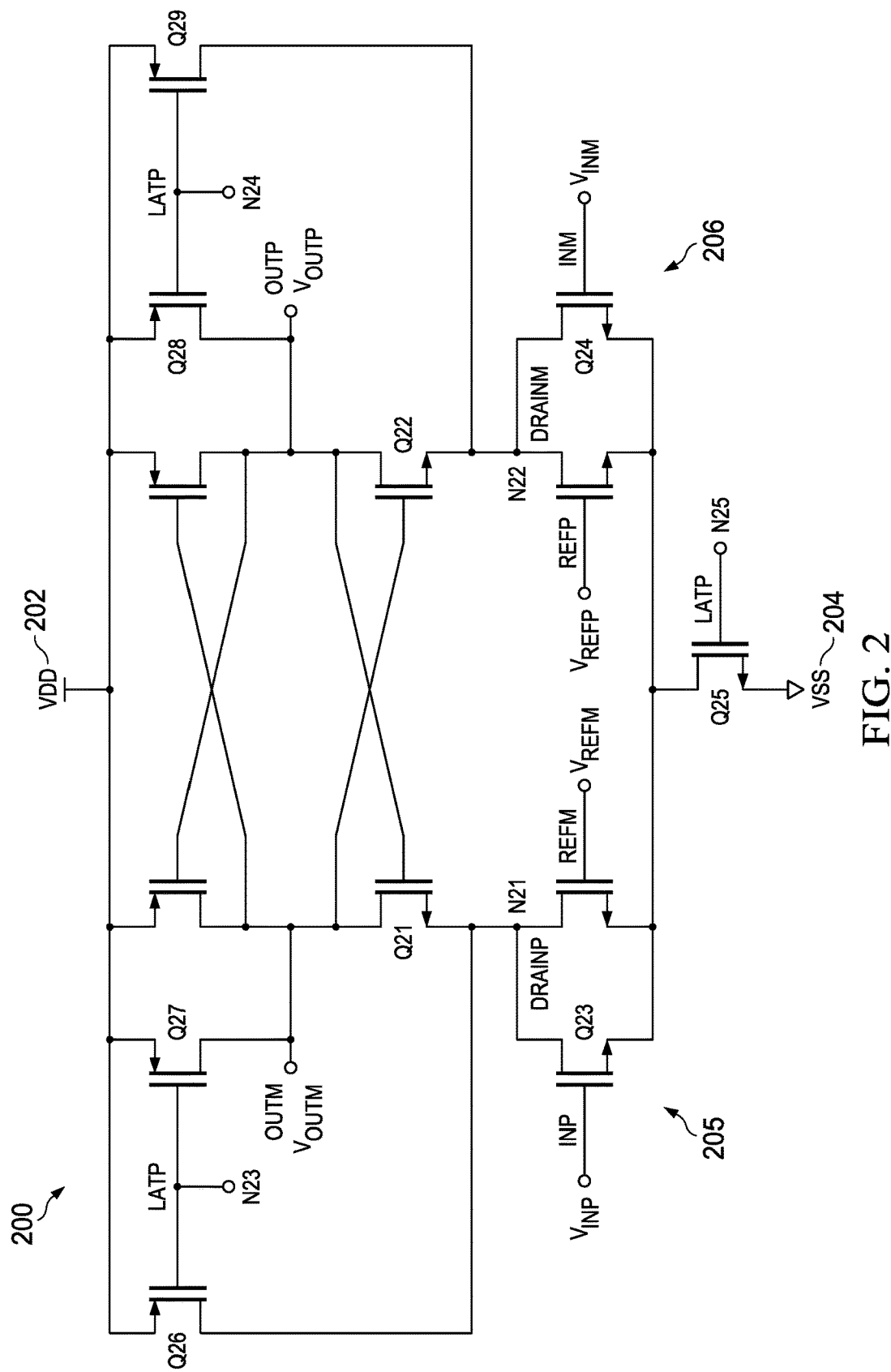
FIG. 2 is a schematic diagram of a comparator.

FIG. 2 is a schematic diagram of a comparator 200 that may be an implementation of one of the comparators 130 of FIG. 1. The comparator 200 is powered by a first voltage source 202 having a voltage potential of VDD relative to a second voltage source 204. In the example of FIG. 2, the second voltage source 204 is a ground and is referenced as VSS. The comparator 200 includes a first input stage 205 and a second input stage 206. A reference input REFM is coupled to the first input stage 205 and a reference input REFP is coupled to the second input stage 206. A reference voltage $V_{REFM}$ is present at the reference input REFM during operation of the comparator 200 and a reference voltage $V_{REFP}$ is present at the reference input REFP during operation of the comparator 200. The reference voltages $V_{REFP}$ and $V_{REFM}$ are typically DC voltages. The comparator 200 further includes a first signal input INP coupled to the first input stage 205 and a second signal input INM coupled to the second input stage 206. The first signal input INP has a signal $V_{INP}$ present during operation of the comparator 200 and the second signal input INM has a signal $V_{INM}$ present during operation of the comparator 200.

The comparator 200 includes a node N21 and a node N22, wherein a signal DRAINP is present at the node N21 and a signal DRAINM is present at the node N22 during operation of the comparator 200. Three nodes N23, N24, and N25 are coupled to a reset LATP signal as described in detail below. An output OUTM is coupled to the drain of a transistor Q21 and an output OUTP is coupled to the drain of a transistor Q22 with a signal $V_{OUTM}$ present at the output OUTM and a signal $V_{OUTP}$ present at the output OUTP. The signals $V_{OUTM}$ and $V_{OUTP}$ are typically complementary after the comparator 200 has made a decision or comparison as described below. In the example of FIG. 2, inverters associated with transistors Q21 and Q22 are referred to as back-to-back or cross-coupled inverters. The portion of the comparator 200 associated with transistors Q21, Q22 and Q26-29 is referred to as the output stage of the comparator 200.

The threshold voltage $V_{TC}$ of the comparator 200 is defined as the difference between the reference voltages $V_{REFP}$ and $V_{REFM}$. When the LATP signal is logic 0 or low, the comparator 200 is in a reset phase wherein the signals DRAINP, DRAINM, $V_{OUTP}$, and $V_{OUTM}$ are all charged to the voltage VDD. For example, the low LATP signal turns off transistor Q25 and the low LATP signal turns on transistors Q26, Q27, Q28, and Q29. The low LATP signal thus disconnects the comparator 200 from the VSS potential and connects the signals DRAINP, DRAINM, $V_{OUTP}$, and $V_{OUTM}$ directly to VDD. When the LATP signal transitions to logic 1 or is high, the comparator 200 enters a decision phase causing the nodes N21 and N22 to discharge to VSS, which results in the signals DRAINP and DRAINM discharging to VSS. The back-to-back inverters associated with transistors Q21 and Q22 regenerate and one of either OUTM or OUTP outputs a voltage VDD depending on the input voltages $V_{INP}$ and $V_{INM}$.

The transition to the decision phase causes kickback noise in the form of a kickback voltage at the inputs INP and INM and at the reference inputs REFM and REFP. Sudden voltage changes on the drain and source nodes of the input transistors in the input stages 205 and 206 occur when the comparator 200 transitions to the decision phase and these voltage changes may change the input voltage instantaneously. The size of transistors Q23 and Q24 determines the magnitude of kickback on the inputs INP and INM. The kickback voltages significantly limit the resolution of the comparator 200 by generating erroneous voltages on the inputs INP and INM of the comparator 200. The significance of the kickback voltages is enhanced when a plurality of comparators similar to the comparator 200 are used in multibit ADCs, such as in the ADC 116 of FIG. 1. For example, an n-bit ADC, such as implemented by the ADC 116, has $2^n$ comparators switching at the same instant and each comparator generates kickback, so the cumulative kickback noise in the ADC 116 is significant. In addition to the kickback, the ADC 116 needs $2^{n-1}$ reference voltages, which increases power, area consumption, and complexity of the ADC 116.

Figure 3:
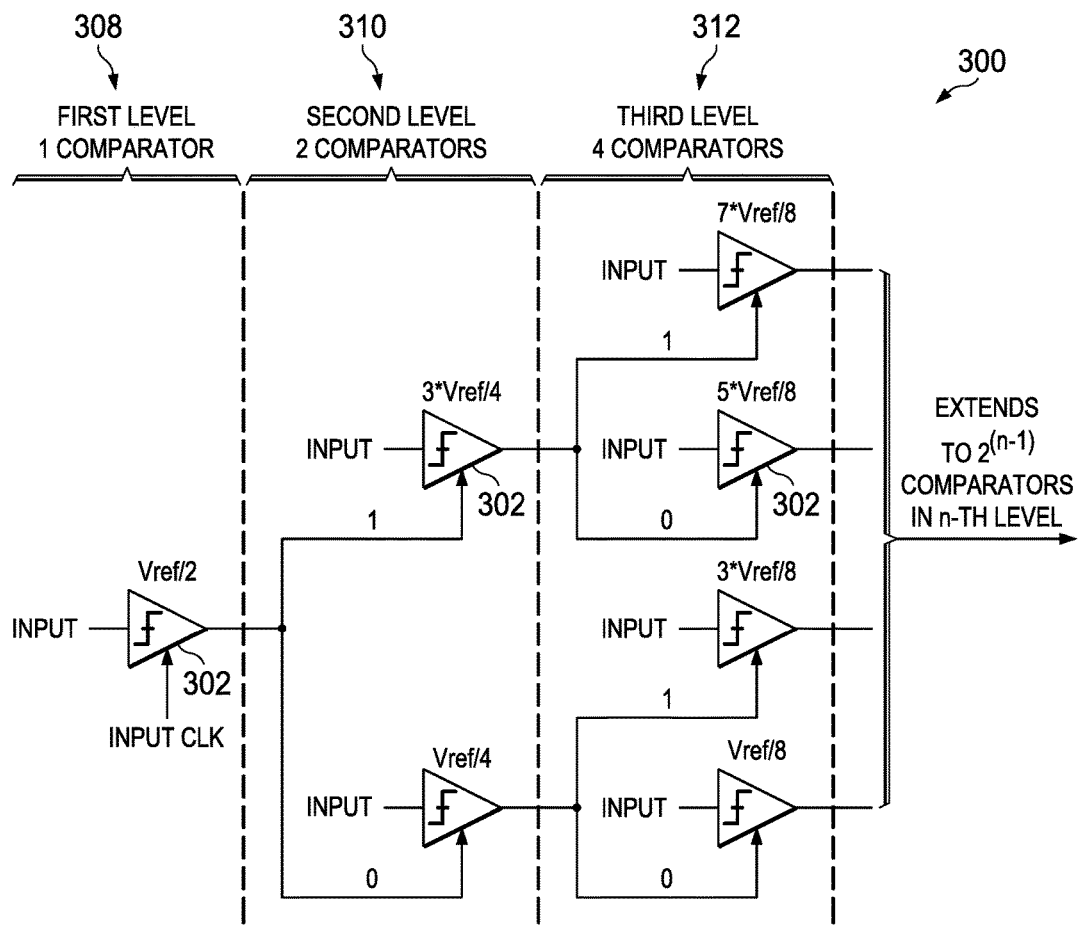
FIG. 3 is a detailed block diagram of an example ADC that may be implemented as the ADC of FIG. 1.

FIG. 3 is a detailed block diagram of an example ADC 300 that may be an implementation of the ADC 116 of FIG. 1 using comparators 302, which may be identical or substantially similar to the comparator 200 of FIG. 2. The ADC 300 is the type of ADC that is sometimes referred to as an n-bit flash ADC. The ADC 300 includes several levels of comparators 302. In the example of FIG. 3, the ADC 300 has three levels of comparators 302, a first level 308, a second level 310, and a third level 312. The first level 308 has one comparator, the second level 310 has two comparators, and the third level 312 has four comparators. For an ADC with n-bit resolution, there are n levels of comparators with $2^n-1$ comparators in total and $2^{(n-1)}$ comparators in the nth level, with n comparators switching or transitioning to the decision state sequentially. The ADC 300 requires $2^{(n-1)}$ reference voltages to operate. During operation, comparators in the third level 312 are triggered by the decisions of comparators in the second level 310. The time required to generate an output from the ADC 300 is therefore $n*T_C$, where n is the number of levels of comparators and $T_C$ is the time required for a comparator to generate an output or make the decision based on the inputs. Because switching occurs sequentially, one comparator kicks back at a given instant during the sequential operation of the ADC 300. The ADC 300 has relatively low speed and power consumption and relatively high resolution. However, the low speed limits the implementation of the ADC 300 in many direct sampling receivers and other devices requiring high speed or high sampling rates.

Figure 4:
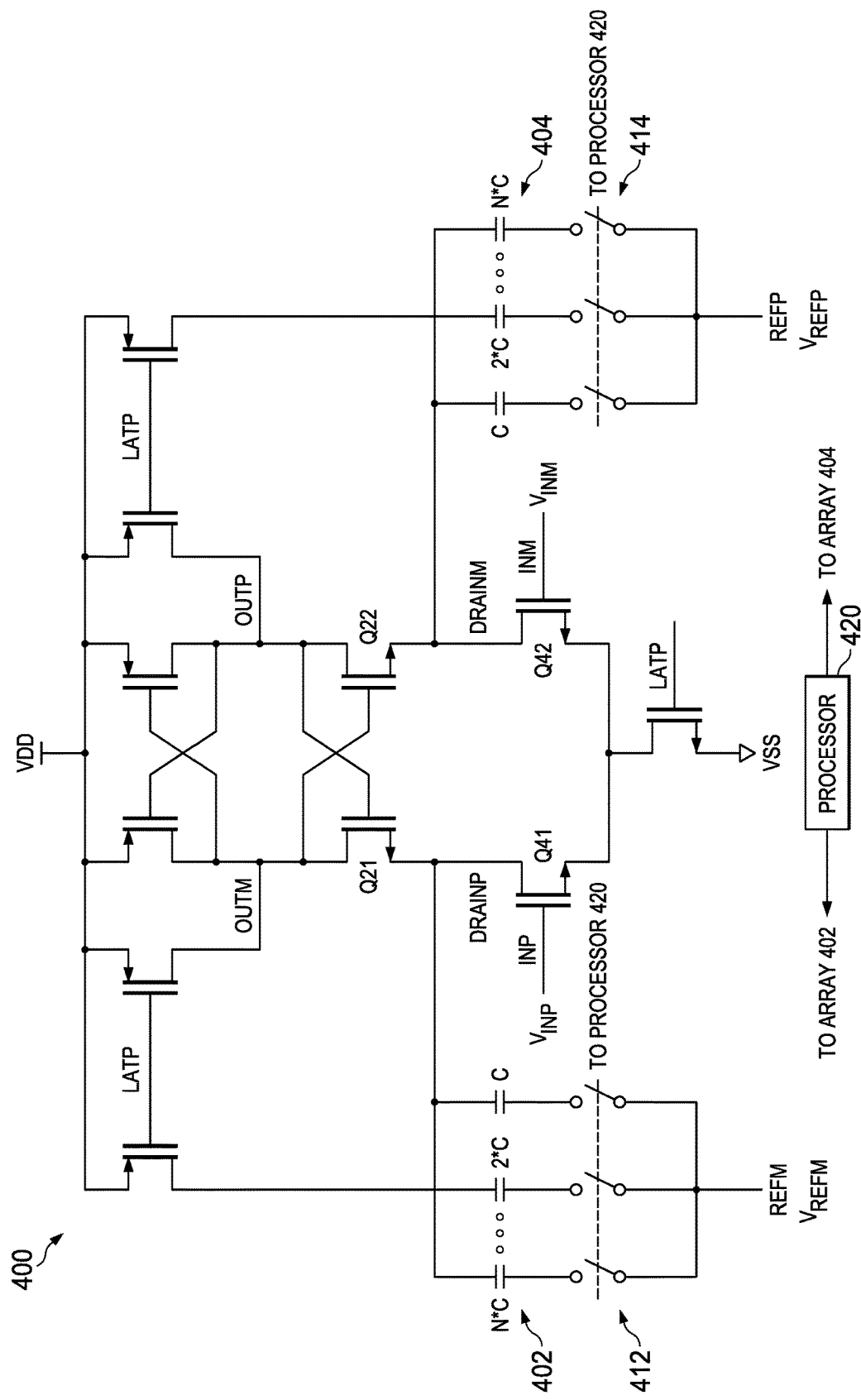
FIG. 4 is a schematic diagram of an inbuilt threshold comparator that provides a discrete number of thresholds.

FIG. 4 is a schematic diagram of an inbuilt threshold comparator 400 that provides a discrete number of threshold voltages $V_{TC}$. The comparator 400 differs from the comparator 200 of FIG. 2 in many ways as described herein. These differences include the inputs REFP and REFM of the comparator 400 being coupled to capacitive arrays 402 and 404. In the example of FIG. 4, the capacitor arrays 402 and 404 are binary weighted arrays, meaning that the individual capacitors in the arrays 402 and 404 have different values. The signals $V_{REFM}$ and $V_{REFP}$ are present at the reference inputs REFP and REFM during operation of the comparator 400. The capacitors in the array 402 are coupled to the reference input REFM by a plurality of switches 412 and the capacitors in the array 404 are coupled to the reference input REFP by a plurality of switches 414. The states of the switches 412 and 414 are controlled by a processor 420. The inputs INP and INM are coupled to gates of transistors Q41 and Q42, respectively.

The voltage threshold $V_{TC}$ of the comparator 400 is determined by the capacitance or the number of capacitors coupled to the reference inputs REFM and REFP by the processor 420. The arrays 402 and 404 enable $2^p$ discrete voltage thresholds $V_{TC}$ to be obtained from the arrays 402 and 404, wherein p is the number of capacitors in each of the arrays 402 and 404. An n-bit ADC implementing the comparator 400 only needs two reference voltages $V_{REFP}$ and $V_{REFM}$, but the ADC needs one comparator 400 for each bit. Therefore, an n-bit ADC implementing the comparator 400 requires $2^n$ capacitor arrays, which consumes an extremely high amount of area on a circuit. Furthermore, the capacitors in the arrays 402 and 404 have some mismatch that generates an offset that varies with each threshold setting. The above-described anomalies result in the comparator 400 not being suitable for high resolution applications or needing sophisticated offset correction for each threshold setting to be suitable for high resolution applications. Another problem with the comparator 400 is that kickback on the inputs INP and INM occurs during the transitions, as described with reference to the comparator 200, FIG. 2.

Figure 5:
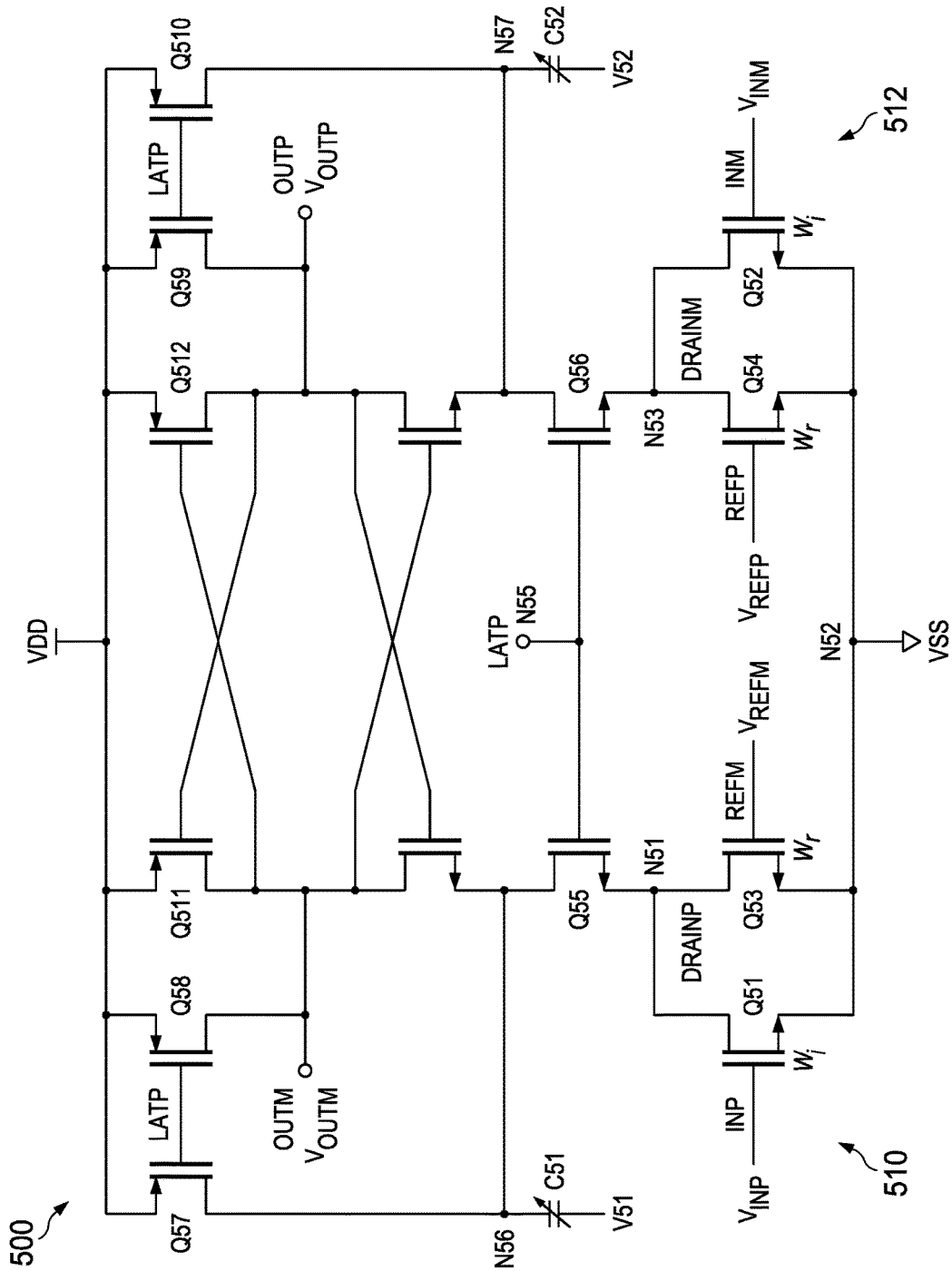
FIG. 5 is a schematic diagram of an inbuilt threshold comparator that overcomes anomalies with the comparators of FIGS. 2 and 4.

FIG. 5 is a schematic diagram of an inbuilt threshold comparator 500 that overcomes anomalies with the comparators 200 and 400 of FIGS. 2 and 4. The comparator 500 includes an input INP that receives an input signal $V_{INP}$ and an input INM that receives an input signal $V_{INM}$. The input INP is coupled to the gate of a transistor Q51 and the input INM is coupled to the gate of a transistor Q52. The drain of transistor Q51 is coupled to a node N51 and the source of transistor Q51 is coupled to a node N52, which in the example of FIG. 5 is ground. The drain of transistor Q52 is coupled to a node N53 and the source of transistor Q52 is coupled to node N52. A reference input REFM receives a reference voltage $V_{REFM}$ and a reference input REFP receives a reference voltage $V_{REFP}$. The input REFM is coupled to the gate of a transistor Q53, the drain of transistor Q53 is coupled to node N51, and the source of transistor Q53 is coupled to node N52. The reference input REFP is coupled to the gate of a transistor Q54, the drain of transistor Q54 is coupled to node N53, and the source of transistor Q54 is coupled to node N52. The reset LATP signal is received at a node N55, which is coupled to the gate of a transistor Q55 and the gate of a transistor Q56. The circuitry associated with the outputs OUTM and OUTP is substantially similar to the circuitry of the comparators 200 and 400 of FIG. 4 and is referred to as the output stage of the comparator 500.

Transistors Q51 and Q53 constitute a first input stage 510 of the comparator 500 and transistors Q52 and Q54 constitute a second input stage 512 of the comparator 500. Transistors Q51 and Q52 have similar widths noted by $W_i$ and transistors Q53 and Q54 have similar widths noted by $W_r$. As noted by equation (1) below, the difference between the potentials on nodes N51 and N53, which are coupled to the drains of the transistors Q51 and Q52, may, in some examples, always equal to zero, which prevents voltage kickback on the inputs INP and INM. Equation (1) shows the simplified expression for the difference in currents, as functions of widths and threshold voltages, through the drain nodes as follows:

$$W_i(V_{INP}-V_{TH})+W_r(V_{REFM}-V_{TH})=W_i(V_{INM}-V_{TH})+W_r(V_{REFP}-V_{TH}) \quad \text{Equation (1)}$$

where $V_{TH}$ is the threshold voltage of transistors Q51, Q52, Q53, Q54. The threshold voltage $V_{TC}$ of the comparator 500 is defined by equation (2) as follows:

$$V_{TC}=(W_r/W_i)(V_{REFP}-V_{REFM}) \quad \text{Equation (2)}$$

As shown by equation (2), the threshold voltage $V_{TC}$ of the comparator 500 is set by the ratio of the transistor widths $W_r$ to $W_i$. This threshold voltage setting enables all the comparators in an ADC to operate from two reference voltages $V_{REFM}$ and $V_{REFP}$, which reduces the complexity of ADCs implementing the comparator 500 relative to traditional ADCs. In addition, capacitor arrays, which use significant area, are not required to set the threshold voltage $V_{TC}$ of the comparator 500. Furthermore, the input common mode of the comparator 500 tracks with process, voltage, and temperature (PVT) variations, which results in better control of the offset voltages and the noise as explained below.

During operation of the comparator 500, transistors Q51 and Q52 begin operating from linear regions and then enter the saturation region. They start from the linear region because their drain to source potentials are zero, so both potentials are at VSS during the reset phase. After the decision is made, the potentials of the drain and source nodes are again at VSS. Since the potentials are the same during reset phase and the end of decision phase, there is no kickback on the inputs INP and INM.

Offset correction in the comparator 500 is performed by a capacitor C51 coupled between a voltage source V51 a node N56 and a capacitor C52 coupled between a voltage source V52 and a node N57. Each comparator in a device, such as an ADC, has its own voltage sources connected to capacitors C51 and C52. The offset correction is achieved by selection of values for the capacitors C51 and C52. In the example of FIG. 5, the capacitors C51 and C52 are variable capacitors and in some examples, different voltages applied to capacitors C51 and C52 result in different values of their capacitances. By applying appropriate voltages to capacitors C51 and C52, appropriate capacitance may be selected so that the difference in capacitance cancels out the offsets present in the comparator 500. In some examples, the voltages applied to the capacitors C51 and C52 are generated by circuitry such as a digital offset calibration loop (not shown) that runs in the background. The use of the capacitors C51 and C52 reduces the noise within the comparator 500 by limiting the noise bandwidth of the comparator 500. The use of the capacitors C51 and C52 also maintains the offset fairly constant irrespective of the threshold voltage $V_{TC}$ because the values of the capacitors C51 and C52 are independent of the threshold voltage $V_{TC}$.

The reset function is performed by way of the LATP signal, which is coupled to the gates of transistors Q55, Q56, Q57, Q58, Q59, and Q510. When the LATP signal is logic 0, the comparator 500 is in a reset phase causing the potentials of the signals DRAINP, DRAINM to be at VSS (ground) and the signals $V_{OUTP}$, and $V_{OUTM}$ to be charged to the voltage VDD. For example, the low LATP signal turns off transistors Q55 and Q56 and turns on transistors Q57, Q58, Q59, and Q510. The low LATP signal thus disconnects the output stage of the comparator 500 from the input stages 510 and 512, which prevents kickback on the inputs INP and INM. When the LATP signal transitions to logic 1, the comparator 500 enters a decision phase that causes the potentials at the nodes N51 and N53 to rise a little during the beginning of the decision phase and then the potentials transition back to ground. Thus, there is no discharge from the drain nodes of transistors Q51 and Q52, which prevents kickback. The back-to-back or cross-coupled inverters associated with transistors Q51 and Q52 regenerate and one of either OUTM or OUTP outputs a voltage VDD, depending on the input voltages $V_{INP}$ and $V_{INM}$.

Transistors Q55 and Q56 may be substantially larger than the transistors Q51 and Q52 that are coupled to the inputs INM and INP. For example, transistors Q55 and Q56 may have greater widths than transistors Q51 and Q52. The smaller widths of transistors Q51 and Q52 induce less noise and generate lower offset than traditional larger input transistors. The smaller sizes of transistors Q51 and Q52 reduce the common mode current flowing through the input pair and improve the noise of the comparator 500. For the same noise specifications, the input pair of transistors Q51 and Q52 of the comparator 500 is half the size of the comparator 200 of FIG. 2. The smaller input transistors Q51 and Q52 also draw lower loads on the inputs INP and INM relative to conventional comparators, which reduces the loads on the sources of the signals $V_{INP}$ and $V_{INM}$.

In some examples, the comparator 500 has the additional benefit of common mode tracking with PVT variations to keep the offset and noise controlled with the PVT variations. In these examples, a bias voltage which varies with PVT is generated from a transistor (not shown) that is identical to the input transistors, such as transistors Q51 and Q52. The bias voltage serves as the input common voltage. The input transistors Q51 and Q52 always have the same overdrive voltage ($V_{GS}-V_{TH}$), where $V_{GS}$ is the gate to source voltage and $V_{TH}$ is the threshold voltage of the transistors Q51 and Q52. This configuration assures that noise and offset do not vary significantly with respect to PVT variations.

Figure 6:
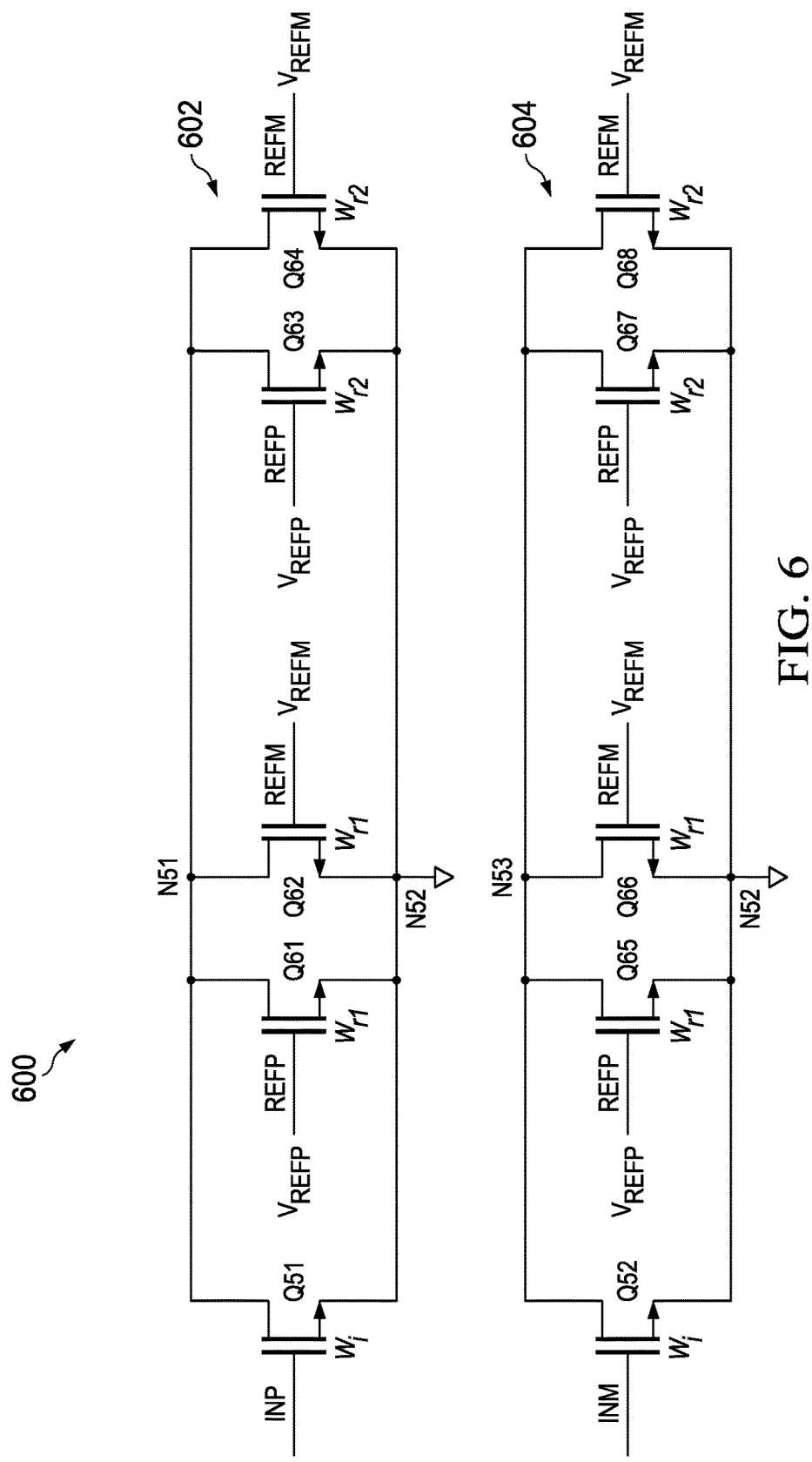
FIG. 6 is a schematic diagram of an example of circuitry that provides alternate input stages for the comparator of FIG. 5.

Different variations of the input stages 510 and 512 of the comparator 500 result in different threshold voltages $V_{TC}$ of the comparator 500. FIG. 6 is a schematic diagram of circuitry 600 that is an example of alternate input stages 510 and 512 of the comparator 500 of FIG. 5. A P-input stage 602 is an example of the first input stage 510 that is coupled to node N51, FIG. 5, and an M-input stage 604 is an example of the input stage 512 that is coupled to node N53, FIG. 5. The P-input stage 602 includes transistor Q51, which is coupled to the input INP and an additional four transistors, Q61, Q62, Q63, and Q64. Transistors Q61 and Q62 are a first type of transistor having widths $W_{r1}$ and transistors Q63 and Q64 are a second type of transistor having widths $W_{r2}$. The gates of transistors Q61 and Q63 are coupled to the input REFP where the voltage $V_{REFP}$ is present and the gates of transistors Q62 and Q64 are coupled to the input REFM where the voltage $V_{REFM}$ is present. The M-input stage 604 includes transistor Q52, which is coupled to the input INM and an additional four transistors, Q65, Q66, Q67, and Q68. Transistors Q65 and Q66 are the first type having widths $W_{r1}$ and transistors Q67 and Q68 are the second type having widths $W_{r2}$. The gates of transistors Q65 and Q67 are coupled to an input REFP and the gates of transistors Q66 and Q68 are coupled to an input REFM.

The circuitry 600 yields equation (3) as shown below wherein the comparator 500 implementing the circuitry 600 has a voltage threshold $V_{TC1}$. In the case of equation (3), the voltage threshold $V_{TC1}$ is equal to the difference between $V_{INP}$ and $V_{INP}$, so it is zero.

$$W_i \times (V_{INP}-V_{TH}) + W_{r1} \times (V_{REFP}-V_{TH}) + W_{r2} \times (V_{REFP}-V_{TH}) + W_{r1} \times (V_{REFM}-V_{TH}) + W_{r2} \times (V_{REFM}-V_{TH}) + W_i \times (V_{INM}-V_{TH}) + W_{r1} \times (V_{REFP}-V_{TH}) + W_{r2} \times (V_{REFP}-V_{TH}) + W_{r1} \times (V_{REFM}-V_{TH}) + W_{r2} \times (V_{REFM}-V_{TH})$$
Equation (3)

Figure 7:
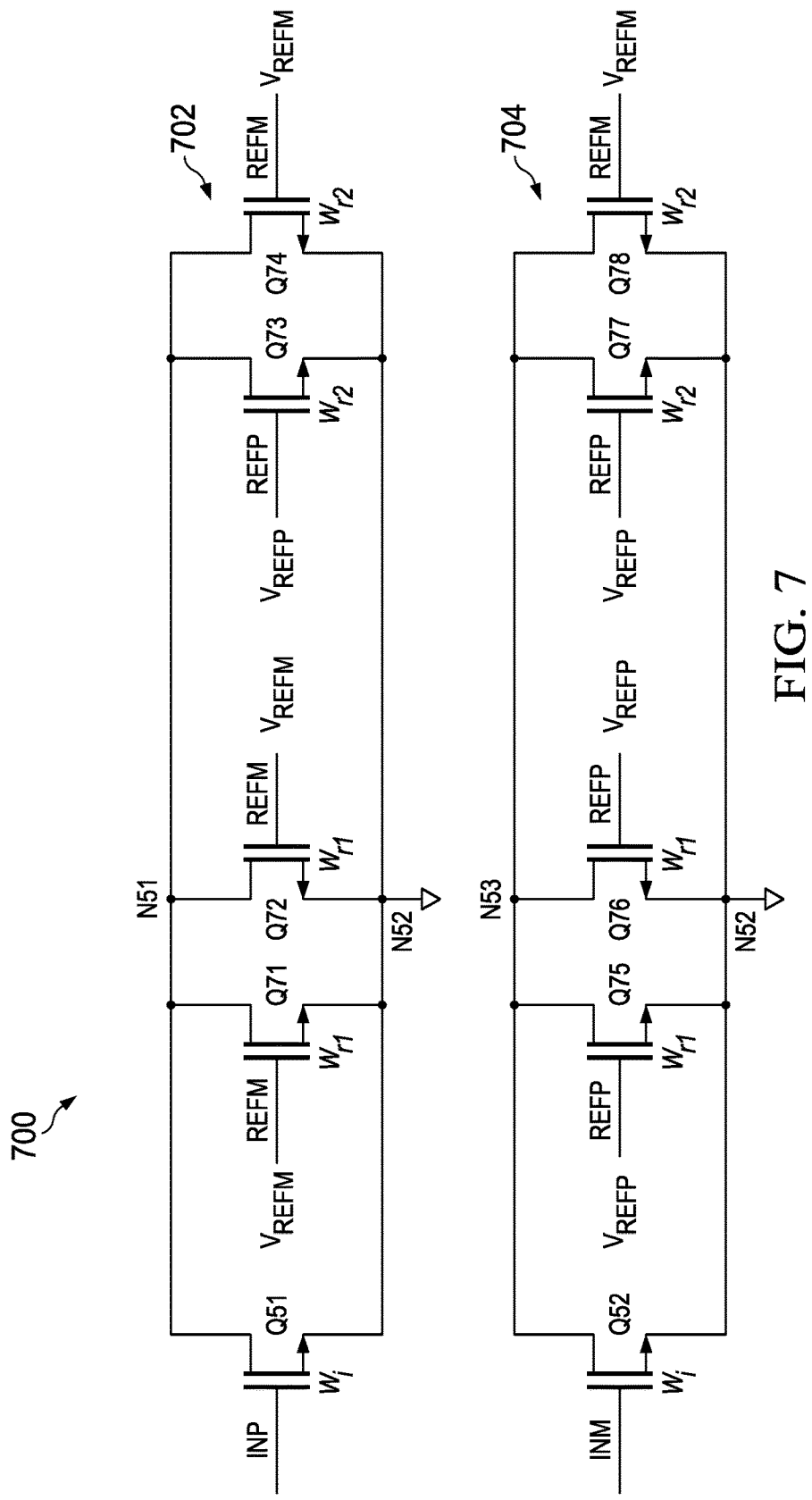
FIG. 7 is a schematic diagram of an example of circuitry that provides alternate input stages for the comparator of FIG. 5.

FIG. 7 is a schematic diagram of an example of circuitry 700 that provides alternate input stages 510 and 512 for the comparator 500 of FIG. 5. The circuitry 700 also provides a different threshold voltage $V_{TC2}$ for the comparator 500 than the circuitry 600 of FIG. 6. A P-input stage 702 is an example of the input INP that is coupled to node N51 of FIG. 5 and an M-input stage 704 is an example of the input INM that is coupled to node N53 of FIG. 5. The P-input stage 702 includes transistor Q51, which is coupled to the input INP and an additional four transistors, Q71, Q72, Q73, and Q74. Transistors Q71 and Q72 are a first type of transistor having widths $W_{r1}$ and transistors Q73 and Q74 are a second type of transistor having widths $W_{r2}$. The gates of transistors Q71, Q72, and Q74 are coupled to the input REFM where the voltage $V_{REFM}$ is present and the gate of transistor Q73 is coupled to the input REFP where the voltage $V_{REFP}$ is present. The M-input stage 704 includes transistor Q52, which is coupled to the input INM and an additional four transistors, Q75, Q76, Q77, and Q78. Transistors Q75 and Q76 are the first type having widths $W_{r1}$, and transistors Q77 and Q78 are the second type having widths $W_{r2}$. The gates of transistors Q75, Q76, and Q77 are coupled to the input REFP wherein the voltage $V_{REFP}$ is present and the gate of transistor Q78 is coupled to the input REFM where the voltage $V_{REFM}$ is present.

The circuitry 700 yields equation (4) as follows:

$$W_i \times (V_{INP}-V_{TH}) + W_{r1} \times (V_{REFM}-V_{TH}) + W_{r2} \times (V_{REFP}-V_{TH}) + W_{r1} \times (V_{REFM}-V_{TH}) + W_{r2} \times (V_{REFM}-V_{TH}) = W_i \times (V_{INM}-V_{TH}) + W_{r1} \times (V_{REFP}-V_{TH}) + W_{r2} \times (V_{REFP}-V_{TH}) + W_{r1} \times (V_{REFP}-V_{TH}) + W_{r2} \times (V_{REFM}-V_{TH})$$
Equation (4)

Equation (4) yields the threshold voltage $V_{TC2}$ per equation (5) as follows:

$$V_{TC2} = 2 \times \left(\frac{W_{r1}}{W_i}\right) \times (V_{REFP} - V_{REFM})$$
Equation (5)

FIG. 8 is a chart 800 showing different threshold voltages for different input stage configurations of the comparator 500 of FIG. 5. The chart 800 shows five different configurations for the transistors in the input stages and the resulting threshold voltages $V_{TC}$. As shown by the chart 800, different threshold voltages $V_{TC}$ are possible by selection of the transistors and the configuration of the transistors. It is noted that all of the threshold voltages $V_{TC}$ rely one just two reference voltages $V_{REFM}$ and $V_{REFP}$. Configuration 3 of the chart 800 depicts the configuration of FIG. 6 and configuration 4 depicts the configuration of FIG. 7.

As a result of mismatched transistors, the different configurations of the inputs stages produce the same offset, which provides for consistency in correcting for offset using the capacitors C51 and C52 of FIG. 5. Reference is made to transistor Q61 in FIG. 6, which, in the following example, is mismatched. The mismatch results in a change in the threshold voltage of the transistor Q61 noted as $\Delta V_{TH}$ and renders the voltage threshold $V_{TC1}$ with the mismatch according to equation (6) as follows:

$$V_{TC1} = \left(\frac{W_{r1}}{W_i}\right) \times \Delta V_{TH}$$
Equation (6)

When the mismatch is applied to the configuration of FIG. 7, transistor Q71 is mismatched, which yields a voltage threshold $V_{TC2}$ of equation (7) as follows:

$$V_{TC2} = 2 \times \left(\frac{W_{r1}}{W_i}\right) \times (V_{REFP} - V_{REFM}) + \left(\frac{W_{r1}}{W_i}\right) \times \Delta V_{TH}$$
Equation (7)

As shown by equations (6) and (7), the same offset, $(W_{r1}/W_i)\Delta V_{TH}$ applies to both input stage configurations based on a mismatch of a transistor having a width $W_{r1}$.

Figure 9:
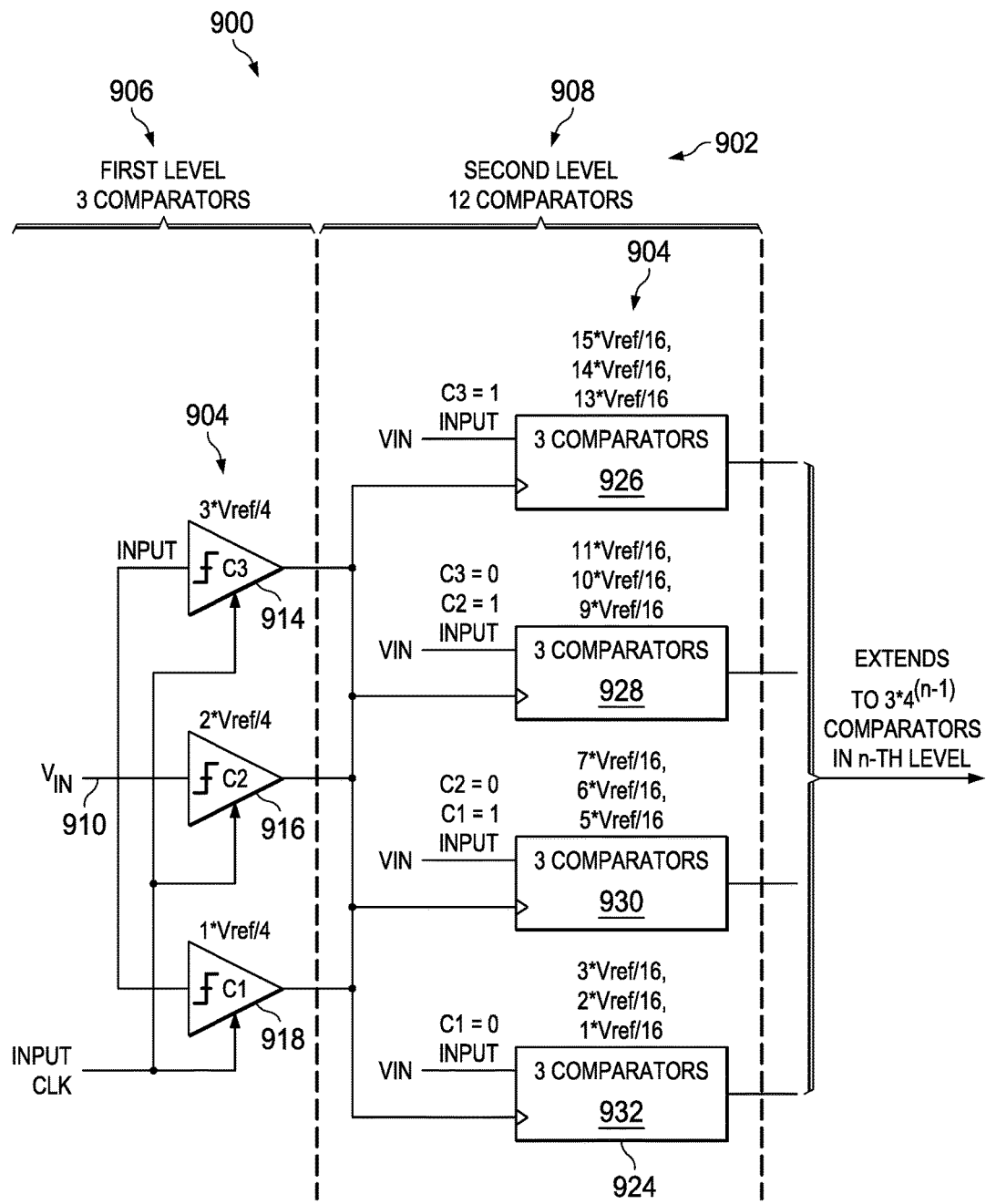
FIG. 9 is a functional representation of an n-bit binary search ADC implementing the comparators of FIGS. 5-7.

FIG. 9 is a functional representation of an n-bit binary search ADC 900 implementing the comparators of FIGS. 5-7. The ADC 900 includes a plurality of levels 902 of comparators 904 including a first level 906 and a second level 908 as shown in FIG. 9. Unlike the ADC 300 of FIG. 3 that has single comparators, the comparators 904 of the ADC 900 are grouped into blocks. That is, the comparators 904 operate as blocks of three comparators. Thus, an ADC having n levels will have $3 \times 4^{(n-1)}$ comparators in the nth level. In the example of FIG. 9, the first level 906 has three comparators 904 coupled to an input 910 that has an input voltage $V_{IN}$ present. The comparators 904 in the first level 906 are also coupled to an input clock that is coupled to the LATP signal described above. The comparators 904 in the first level 906 are referred to individually as comparator 914, comparator 916, and comparator 918 and all have different thresholds. The comparator 914 has a threshold of $3V_{TC}/4$ and generates a signal C3 when it transitions. The comparator 916 has a threshold of $2V_{TC}/4$ and generates a signal C2 when it transitions. The comparator 918 has a threshold of $V_{TC}/4$ and generates a signal C1 when it transitions.

The second level 908 has four blocks 924 of comparators wherein each of the blocks 924 has three comparators. The configuration of the ADC 900 enables it to have one less comparator in the first level 906 than blocks 924 in the second level 908. Each of the blocks 924 may have comparators configured as the comparators 904 in the first layer 906. The blocks 924 are referred to individually as a first block 926, a second block 928, a third block 930, and a fourth block 932, which yields a total of 12 comparators that are able to compare the input voltage $V_{IN}$ to 12 different threshold voltages. For example, the first block 926 compares the input voltage $V_{IN}$ to thresholds of $15V_{TC}/16$, $14V_{TC}/16$ and $13V_{TC}/16$. One block is coupled to the input 910 to compare the input voltage $V_{IN}$ to different voltages depending on the state of the signals C1-C3, which are output from the comparators 904 in the first level 906. For example, the first block 926 is coupled to the input 910 when the signal C3 is high, the second block 928 is coupled to the input 910 when the signal C3 is low and the signal C2 is high, the third block 930 is coupled to the input 910 when the signal C2 is low and the signal C1 is high, and the fourth block 932 is coupled to the input 910 when the signal C1 is low.

The progression of comparing the input voltage $V_{IN}$ to multiple voltages in the different levels 902 provides for high resolution of the input voltage $V_{IN}$ using fewer levels, which provides faster analog-to-digital conversion. The ADC 900 does not require the capacitor arrays described above to set the threshold voltage of the comparators, so the area requirements of the ADC 900 are less than traditional ADCs. In addition, the use of the comparators in FIGS. 5-7 provides the analog-to-digital conversion without kickback on the input 910. The use of fewer comparators 904 results in lower power consumption relative to traditional ADCs.

Although illustrative embodiments have been shown and described by way of example, a wide range of alternative embodiments is possible within the scope of the foregoing disclosure.

What is claimed is:

1. A comparator comprising:
a first input stage coupled to a first signal input and a first reference input, the first input stage coupled between a first node and a second node;
wherein the first input stage comprises:
a first transistor coupled between the first node and the second node, the gate of the first transistor being coupled to the first signal input; and
a first plurality of capacitors coupled to the first node and a first plurality of switches, the first plurality of switches coupled to the first reference input wherein the first plurality of switches is controlled by a processor;
a second input stage coupled to a second signal input and a second reference input, the second input stage coupled between a third node and the second node;
wherein the second input stage comprises:
a second transistor coupled between the third node and the second node, the gate of the second transistor being coupled to the second signal input; and
a second plurality of capacitors coupled to the third node and a second plurality of switches, the second plurality of switches coupled to the second reference input wherein the second plurality of switches is controlled by the processor;
an output stage for generating at least one output signal in response to signals at the first and second signal inputs;
first switching circuitry coupled between the first node and the output stage, the first switching circuitry for coupling the first node to a fourth node in response to a reset signal;
second switching circuitry coupled between the third node and the output stage, the second switching circuitry for coupling the third node to a fifth node in response to the reset signal; and
a threshold voltage wherein the threshold voltage is proportional to the capacitance coupled to the first node and the capacitance coupled to the third node.

2. The comparator of claim 1, wherein the first switching circuitry includes a third transistor and the second switching circuitry includes a fourth transistor, and wherein the reset signal is coupled to the gate of the third transistor and the gate of the fourth transistor.

3. The comparator of claim 1, further comprising a first compensation voltage source coupled to the first switching circuitry and a second compensation voltage source coupled to the second switching circuitry.

4. The comparator of claim 3, wherein the first compensation voltage source includes a capacitor coupled to a voltage source and wherein the capacitance value of the capacitor is a function of the voltage potential applied to the capacitor.

5. The comparator of claim 3, wherein the first compensation voltage source provides a variable voltage.

6. The comparator of claim 1, wherein a first voltage potential is present on the fourth node and a second voltage potential is present on the fifth node, and wherein the first voltage potential is substantially equal to the second voltage potential.

7. An analog-to-digital converter (ADC) comprising:
at least one level of comparators, the level having an analog input and a plurality of outputs, wherein voltage potentials on the plurality of outputs correspond to the potential at the analog input, wherein each comparator comprises:
a first input stage coupled to a first signal input and a first reference input, the first input stage coupled between a first node and a second node;
wherein the first input stage comprises:
a first transistor coupled between the first node and the second node, the gate of the first transistor being coupled to the first signal input; and
a first plurality of capacitors coupled to the first node and a first plurality of switches, the first plurality of switches coupled to the first reference input wherein the first plurality of switches is controlled by a processor;
a second input stage coupled to a second signal input and a second reference input, the second input stage coupled between a third node and the second node;
wherein the second input stage comprises:
a second transistor coupled between the third node and the second node, the gate of the second transistor being coupled to the second signal input; and
a second plurality of capacitors coupled to the third node and a second plurality of switches, the second plurality of switches coupled to the second reference input wherein the second plurality of switches is controlled by the processor;
an output stage for generating at least one output signal in response to signals at the first and second signal inputs;
first switching circuitry coupled between the first node and the output stage, the first switching circuitry for coupling the first node to a fourth node in response to a reset signal;
second switching circuitry coupled between the third node and the output stage, the second switching circuitry for coupling the third node to a fifth node in response to the reset signal; and a threshold voltage wherein the threshold voltage is proportional to the capacitance coupled to the first node and the capacitance coupled to the third node.

8. The ADC of claim 7, further comprising a second level of comparators arranged in a plurality of blocks, wherein individual blocks are coupled to the outputs of comparators in the first level in response to the states of the outputs of the comparators in the first level.

9. The ADC of claim 8, wherein the first level of comparators has one less comparator than the number of blocks in the second level.

10. The ADC of claim 8, wherein the comparators in the second level are coupled to the analog input.

* * * * *